US009000811B2

(12) United States Patent
Wang et al.

(10) Patent No.: US 9,000,811 B2
(45) Date of Patent: Apr. 7, 2015

(54) DRIVER CIRCUIT WITH CONTROLLED GATE DISCHARGE CURRENT

(71) Applicant: STMicroelectronics R&D (Shanghai) Co. Ltd., Shanghai (CN)

(72) Inventors: Fei Wang, Shanghai (CN); Wen Li Bai, Shanghai (CN)

(73) Assignee: STMicroelectronics R&D (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 14/199,313

(22) Filed: Mar. 6, 2014

(65) Prior Publication Data

US 2014/0266322 A1    Sep. 18, 2014

(30) Foreign Application Priority Data

Mar. 18, 2013   (CN) .......................... 2013 1 0096033

(51) Int. Cl.
*H03K 3/00*     (2006.01)
*H03K 17/04*    (2006.01)
*H03K 17/00*    (2006.01)

(52) U.S. Cl.
CPC ..................................... *H03K 17/00* (2013.01)

(58) Field of Classification Search
CPC .... H03K 3/012; H03K 17/164; H03K 17/167
USPC ................................. 327/108, 377; 361/91.1
See application file for complete search history.

(56) References Cited

U.S. PATENT DOCUMENTS

| 5,285,116 | A  | * | 2/1994 | Thaik .............................. 326/21 |
| 5,313,118 | A  | * | 5/1994 | Lundberg ........................ 326/86 |
| 5,898,321 | A  | * | 4/1999 | Ilkbahar et al. ................. 326/87 |
| 6,118,324 | A  | * | 9/2000 | Li et al. ......................... 327/384 |
| 6,556,407 | B2 | * | 4/2003 | Elliott et al. .................. 361/100 |
| 7,034,600 | B2 | * | 4/2006 | Scheikl .......................... 327/376 |
| 7,151,401 | B2 | * | 12/2006 | Inoue ............................ 327/434 |
| 7,741,894 | B2 | * | 6/2010 | Kojima ......................... 327/427 |
| 8,242,830 | B2 | * | 8/2012 | Soma et al. .................... 327/427 |
| 8,410,829 | B2 | * | 4/2013 | Pham ............................ 327/112 |
| 8,497,714 | B2 | * | 7/2013 | Garbossa et al. ............. 327/109 |

* cited by examiner

*Primary Examiner* — Kenneth Wells
(74) *Attorney, Agent, or Firm* — Gardere Wynne Sewell LLP

(57) ABSTRACT

The gate of a drive transistor having a drain and source is discharged by a circuit including a sensing circuit configured to sense a drain-to-source voltage of the drive transistor. A first current sink path is coupled to the gate of the drive transistor. The first current sink path applies a high discharge current to the gate of the drive transistor when the sensing current senses a lower drain-to-source voltage of the drive transistor. A second current sink path is also coupled to the gate of the drive transistor. The second current sink path is configured to apply a low discharge current to the gate of the drive transistor when the sensing current senses a higher drain-to-source voltage of the drive transistor.

23 Claims, 6 Drawing Sheets

DRIVER CIRCUIT WITH CONTROLLED GATE DISCHARGE CURRENT

PRIORITY CLAIM

This application claims priority from Chinese Application for Patent No. 201310096033.6 filed Mar. 18, 2013, the disclosure of which is incorporated by reference.

TECHNICAL FIELD

The present invention relates to driver circuits, including high side and low side driver circuits, having controlled gate discharge current during drive transistor turn-off.

BACKGROUND

It is well known in the art to use a driver circuit to drive a load. The driver circuit may comprise a high side driver circuit including a drive transistor coupled between a high supply voltage node and the load (with the load coupled between the drive transistor and a low supply voltage node, such as ground). The driver circuit may alternatively comprise a low side driver circuit including a drive transistor coupled between the load and the low supply voltage node (with the load coupled between the high supply voltage node and the drive transistor). In another known configuration, the load is driven from both the high side and the low side by separate driver circuits (high side and low side, respectively).

In order to satisfy concerns with electromagnetic interference (EMI) arising from the switching operation of the driver circuit(s) coupled to the load, it is important to control the slew rate for turning on and off of the drive transistor. This can be accomplished by limiting the charge/discharge current at the control node of the drive transistor.

It is further desired in the art to minimize the on/off delay of the driver circuit. This can be accomplished by using large charge/discharge currents at the control node of the drive transistor.

Prior art driver circuits use a single fixed current which is applied for both charge and discharge of the control node of the drive transistor. Finding a single fixed current which satisfies concerns with electromagnetic interference and minimizes on/off delay is challenging. Oftentimes, such a current can be found which satisfies both requirements when turn on the drive transistor (charge of the control node), but falls short with respect to turning off the drive transistor (discharge of the control node).

In one prior art solution shown in FIG. 1, the driver circuit functions (in a high side driver implementation) to detect with the circuitry generally indicated at reference 10 a gate-to-source voltage (Vgs) of the drive transistor 12 and provide a boosted discharge current Id (i.e., a discharge current in excess of the charge current Ic) to the gate of the drive transistor 12 if the detected Vgs exceeds twice the threshold voltage of the drive transistor.

In another prior art solution shown in FIG. 2, the driver circuit functions (in a high side driver implementation) to detect with a comparator circuit 14 a gate-to-drain voltage (Vgd) of the drive transistor and provide a boosted discharge current Id (i.e., a discharge current in excess of the charge current Ic) to the gate of the drive transistor 12 if the detected Vgd exceeds zero.

Both of the prior art solutions disadvantageously draw extra current from the driver circuit high supply voltage node (Vcp) and implement a digitally switched on/off current (driven by the circuitry generally indicated at reference 16).

The prior art solutions also utilize high voltage components that occupy large circuit integration areas. There is a need in the art for an improved driver circuit which does not suffer from the current and switching problems associated with the prior art solutions of FIGS. 1 and 2. In addition, there would be an advantage to provide a circuit that occupies a reduced circuit integration area.

SUMMARY

In an embodiment, a circuit for discharging a gate of a drive transistor having a drain and source comprises: a sensing circuit configured to sense a drain-to-source voltage of the drive transistor; a first current sink path configured to be coupled to the gate of the drive transistor, said first current sink path configured to apply a high discharge current to the gate of the drive transistor when the sensing current senses a lower drain-to-source voltage of the drive transistor; and a second current sink path configured to be coupled to the gate of the drive transistor, said second current sink path configured to apply a low discharge current to the gate of the drive transistor when the sensing current senses a higher drain-to-source voltage of the drive transistor.

In an embodiment, a method for discharging a gate of a drive transistor having a drain and source comprises: sensing a drain-to-source voltage of the drive transistor; activating a first current sink path coupled to the gate of the drive transistor to apply a high discharge current to the gate of the drive transistor when the sensed drain-to-source voltage of the drive transistor is lower than a threshold; and activating a second current sink path coupled to the gate of the drive transistor to apply a low discharge current to the gate of the drive transistor when the sensed drain-to-source voltage of the drive transistor is higher than a threshold.

In an embodiment, a circuit comprises: a drive transistor having a gate, drain and source; a circuit configured to supply a first current in response to a control signal indicating turn-off of said drive transistor; a sense node connected to receive said first current; a first circuit path connected between the sense node and the source of the drive transistor, said first circuit path presenting a first voltage drop from the sense node to source that is dependent on a drain-to-source voltage of the drive transistor; a second circuit path connected between the sense node and the source of the drive transistor, said second circuit path presenting a second voltage drop from the sense node to source that is independent of the drain-to-source voltage of the drive transistor; a first current sink path configured to apply a first discharge current to the gate of the drive transistor when the first voltage drop is less than the second voltage drop; and a second current sink path configured to apply a second discharge current, less than the first discharge current, to the gate of the drive transistor when the second voltage drop is less than the first voltage drop.

In an embodiment, a circuit comprises: a drive transistor having a gate, drain and source; a circuit configured to supply a first current and a second current in response to a control signal indicating turn-off of said drive transistor; a first node connected to receive said first current; a second node connected to receive said second current; a first current mirroring circuit having an input coupled to the first node and configured to receive the first current and including a first current sink path configured to apply a low discharge current to the gate of the drive transistor; a second current mirroring circuit having a common node at the second node and having an input coupled to the drain of the drive transistor, said second current mirroring circuit outputting a third current when a drain-to-source voltage across the drive transistor is less than a threshold; and a third current mirroring circuit having an input coupled to an output of the second current mirroring circuit and configured to receive the second current and including a second current sink path configured to apply a high discharge current to the gate of the drive transistor.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
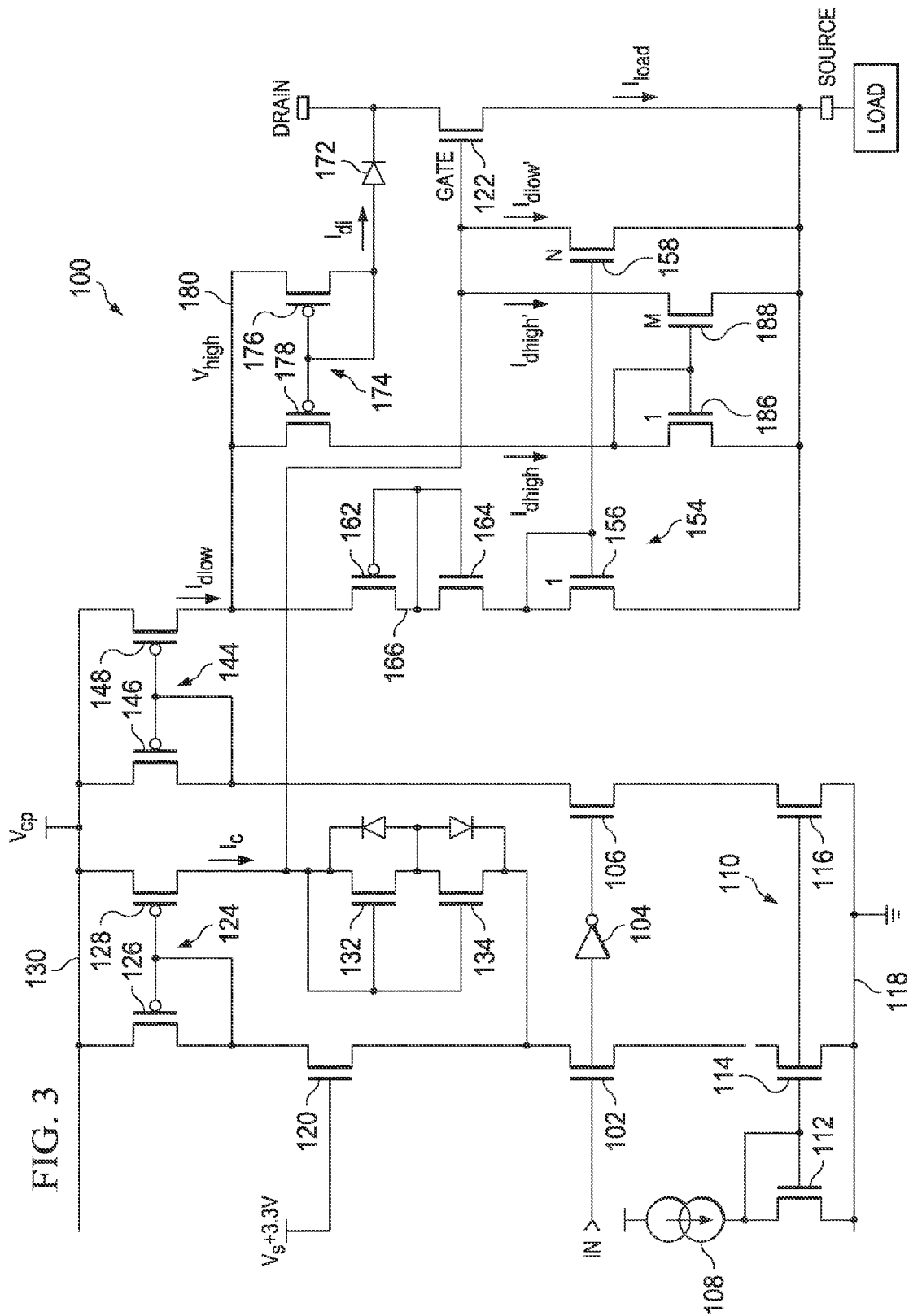
FIG. 3 is a schematic diagram of a high side driver circuit.

Reference is now made to FIG. 3 which illustrates a schematic diagram of a high side driver circuit 100 including a drive transistor 122. The circuit 100 includes a first input transistor 102 having a control node (gate) configured to receive a digital input signal IN. A logical NOT gate 104 has an input coupled to receive the digital input signal IN and an output coupled to a control node (gate) of a second input transistor 106. The input transistors 102 and 106 are preferably n-channel MOSFET devices.

A bias current generator 108 supplies current to an input of a current mirror circuit 110 formed by transistors 112, 114 and 116. The control nodes (gates) of transistors 112, 114 and 116 are connected together and to the conduction node (drain) of transistor 112, where that drain node forms the input of the current mirror circuit 110. The conduction node (drain) of transistor 114 is coupled to the conduction node (source) of transistor 102, and the conduction node (drain) of transistor 116 is coupled to the conduction node (source) of transistor 106. The conduction nodes (sources) of transistors 112, 114 and 116 are coupled to a low voltage supply node 118 (for example ground). The transistors 112, 114 and 116 are preferably n-channel MOSFET devices.

A gate charging transistor 120 has a conduction node (source) coupled to the conduction node (drain) of transistor 102. The control node (gate) of transistor 120 is coupled to receive a regulated voltage equal to the voltage at the conduction node (source) of the drive transistor 122 plus a fixed voltage of 3.3V. The function of this transistor 120 will be described in more detail below. The transistor 120 is preferably an n-channel MOSFET device.

A current mirror 124 formed by transistors 126 and 128 has an input coupled to the conduction node (drain) of transistor 120. The control nodes (gates) of transistors 126 and 128 are connected together and to the conduction node (drain) of transistor 126, where the drain node forms the input of the current mirror circuit 124. The conduction nodes (sources) of transistors 126 and 128 are coupled to a high voltage supply node 130 (Vcp) which in a preferred embodiment is a pumped voltage in excess of the drain voltage of the drive transistor 122. The conduction node (drain) of transistor 128 forms an output of the current mirror 124 and supplies a gate charging current Ic to the control node (gate) of the drive transistor 122. The transistors 126 and 128 are preferably p-channel MOSFET devices.

Series connected transistors 132 and 134 are coupled between the control node (gate) of the drive transistor 122 and the conduction node (drain) of transistor 102. The control node (gates) of transistors 132 and 134 are coupled together and to the conduction node (drain) of transistor 132. The transistors 132 and 134 are preferably n-channel MOSFET devices. The transistors 132 and 134 are used when turning on the circuit 100 (i.e., in response to a logic high value of the input signal IN), and they function to clamp the voltage at the gate of drive transistor 122.

A current mirror 144 formed by transistors 146 and 148 has an input coupled to the conduction node (drain) of transistor 106. The control nodes (gates) of transistors 146 and 148 are connected together and to the conduction node (drain) of transistor 146, where the drain node forms the input of the current mirror circuit 144. The conduction nodes (sources) of transistors 146 and 148 are coupled to the high voltage supply node 130 (Vcp). The conduction node (drain) of transistor 148 forms an output of the current mirror 144 and supplies a low gate discharging current Idlow (when the input signal IN transitions to logic low and transistor 106 is actuated). The transistors 146 and 148 are preferably p-channel MOSFET devices.

A current mirror 154 formed by transistors 156 and 158 has an input coupled to the conduction node (drain) of transistor 148. The control nodes (gates) of transistors 156 and 158 are connected together and to the conduction node (drain) of transistor 156, where the drain node forms the input of the current mirror circuit 154. The conduction nodes (sources) of transistors 156 and 158 are coupled to the conduction node (source) of drive transistor 156. The conduction node (drain) of transistor 158 forms an output of the current mirror 154 and supplies a scaled low gate discharging current Idlow'. The size of the transistors 156 and 158 of current mirror 154 are selected with a ratio of 1:N so that Idlow'=N*Idlow. In a preferred implementation, N=20, but it will be understood that any suitable value of N may be chosen dependent on, for example, the size of the drive transistor 122 and reference current Idlow and the slew rate requirement for driver operation. The larger the ratio, the longer the turn-on delay for the current mirror 154. The transistors 156 and 158 are preferably n-channel MOSFET devices.

Series connected transistors 162 and 164 are coupled between the conduction node (drain) of the transistor 148 (output of current mirror 144) and the conduction node (drain) of transistor 156 (input of current mirror 154). The control node (gates) of transistors 162 and 164 are coupled together and to node 166 as the series connection point of transistors 162 and 164. Node 166 is coupled to the drain of transistor 162 and coupled to the drain of transistor 164. The transistors 162 and 164 are configured to add two drain-to-source voltage drops between the output of the current mirror 144 and the source of transistor 122. The reason this is needed will be explained in more detail below. The transistor 162 is preferably a p-channel MOSFET device and the transistor 164 is preferably an n-channel MOSFET device.

A current mirror 174 formed by transistors 176 and 178 has an input coupled to the conduction node (drain) of drive transistor 122 through a diode 172. The control nodes (gates) of transistors 176 and 178 are connected together and to the conduction node (drain) of transistor 176, where the drain node forms the input of the current mirror circuit 174 connected to the anode terminal of diode 172. The cathode terminal of diode 172 is connected to the conduction node (drain) of drive transistor 122. The conduction nodes (sources) of transistors 176 and 178 are coupled to a high reference node 180 (Vhigh), with the high reference node 180 coupled to the conduction node (drain) of transistor 148. The conduction node (drain) of transistor 178 forms an output of the current mirror 174 and supplies a high gate discharging current Idhigh. The transistors 176 and 178 are preferably p-channel MOSFET devices. In a preferred implementation, the transistor 176 should match transistor 162 so that the two gate-to-source voltage corners are cancelled in the sensing of the drain-to-source voltage of the drive transistor 122.

A current mirror 184 formed by transistors 186 and 188 has an input coupled to the conduction node (drain) of transistor 178. The control nodes (gates) of transistors 186 and 188 are connected together and to the conduction node (drain) of transistor 186, where the drain node forms the input of the current mirror circuit 184. The conduction nodes (sources) of transistors 186 and 188 are coupled to the conduction node (source) of drive transistor 122. The conduction node (drain) of transistor 188 forms an output of the current mirror 184 and supplies a scaled high gate discharging current Idhigh'. The size of the transistors 186 and 188 of current mirror 184 are selected with a ratio of 1:M so that Idhigh'=M*Idhigh. In a preferred implementation, M=160, but it will be understood that any suitable value of M may be chosen dependent, on, for example, the size of the drive transistor 122 and reference current Idhigh and the delay requirement for driver operation. The larger the ratio, the longer the turn-on delay for the current mirror 184. If a large current Idhigh' is needed, a relatively smaller value of M can be used if the reference current Idhigh is correspondingly increased. The transistors 186 and 188 are preferably n-channel MOSFET devices.

In a preferred implementation, M>N.

Figure 1:
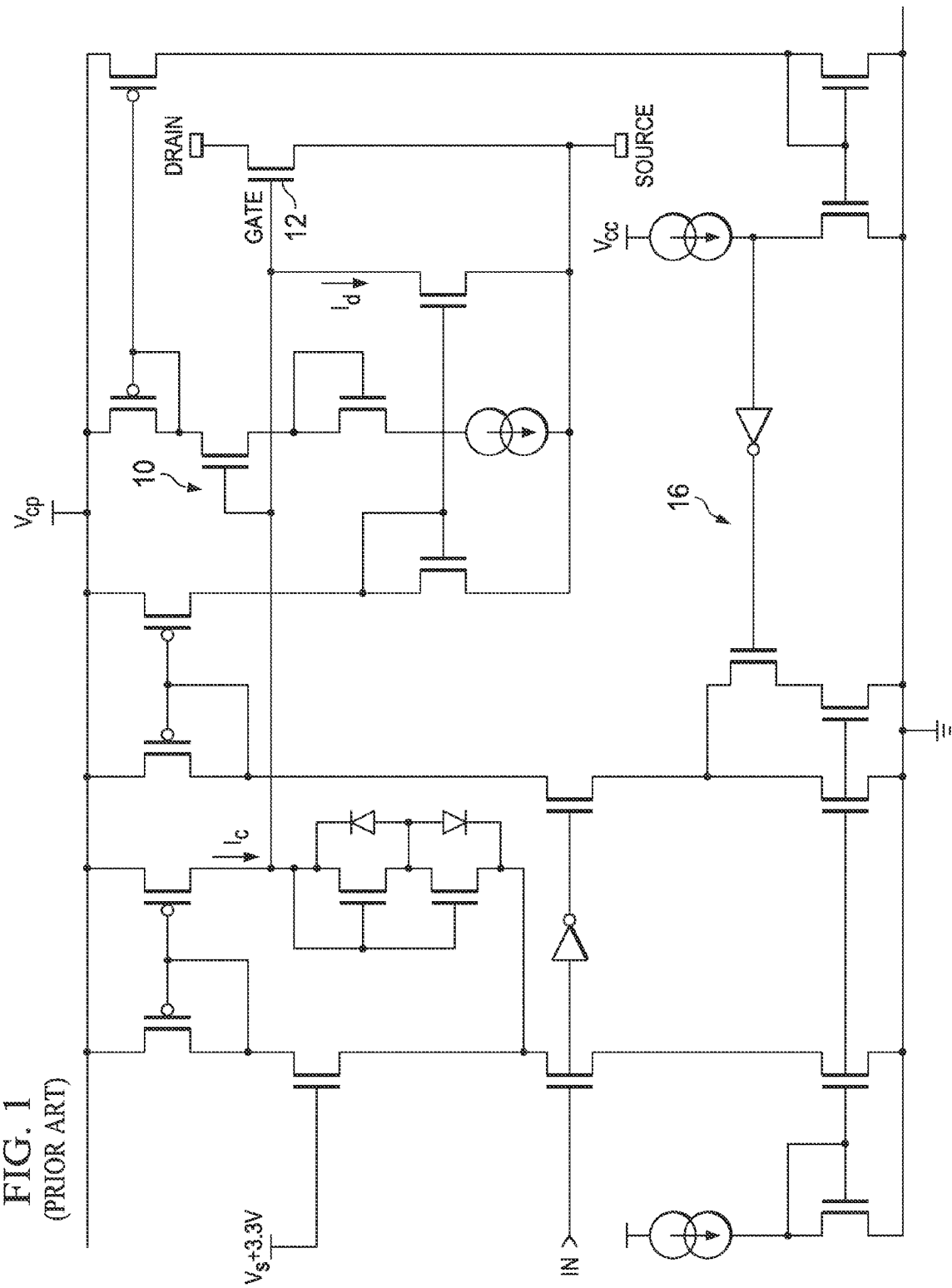
FIGS. 1 and 2 are schematic circuit diagrams of prior art driver circuits.
Figure 2:
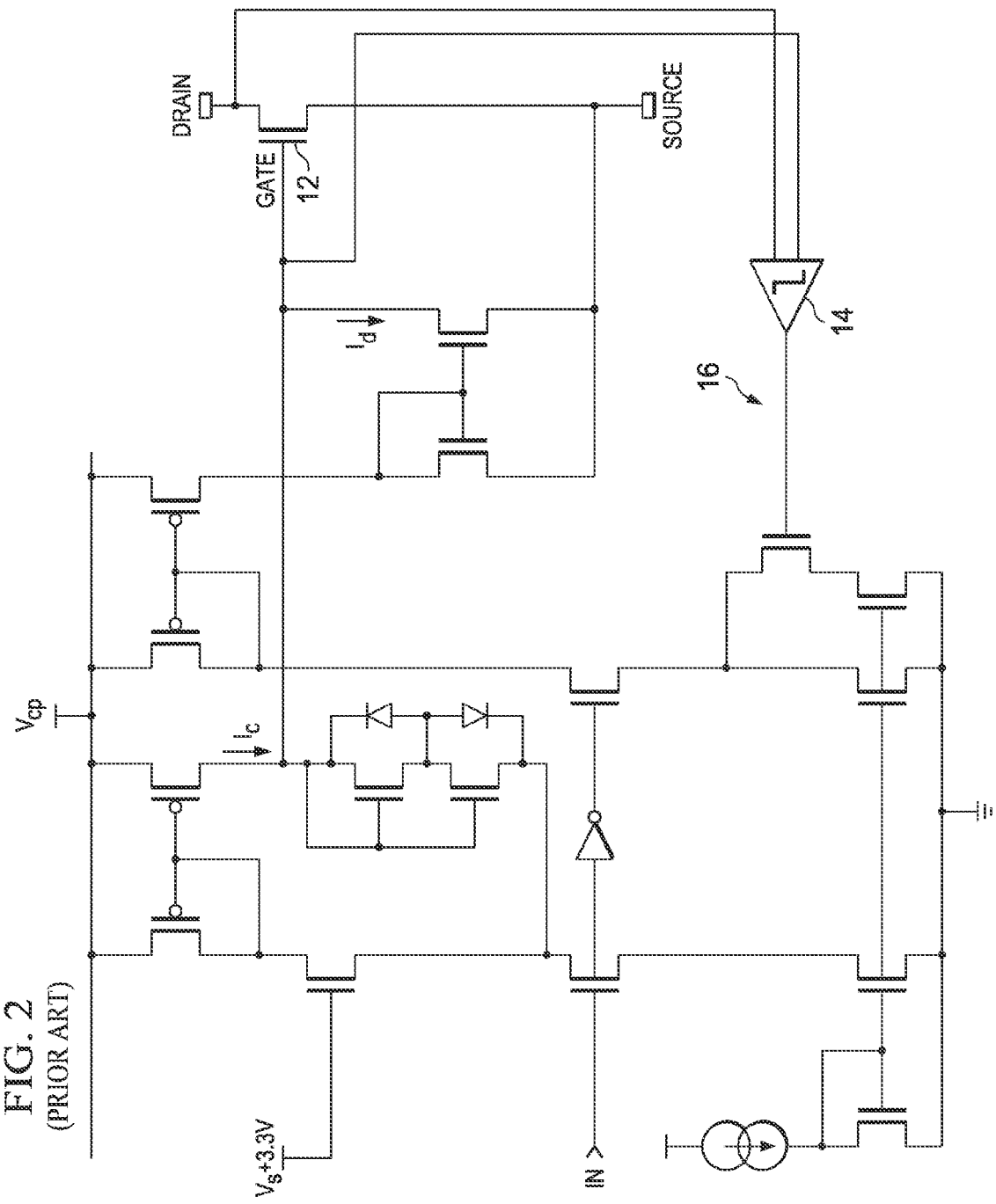

In response to a high logic value for the input signal IN, the driver circuit 100 operates in a manner identical to the prior art circuits of FIGS. 1 and 2. The input signal IN turns on transistor 102 (and turns off transistor 106). The current mirror supplies the charging current Ic to the gate of the drive transistor 122 so as to charge the gate voltage Vg to a value set by the voltage applied to the gate of transistor 120. In the preferred implementation, Vg would be charged to the source voltage (Vs) of transistor 122 plus a fixed voltage of 3.3V. The source voltage Vs would then be equal to the voltage at the drain (Vd) of transistor 122 minus the drain-to-source voltage (Vds) of the transistor 122, where Vds=Rdson*Iload (Rdson being the on resistance of the transistor 122 and Iload being the load current supplied to the load connected at the source of transistor 122).

More specifically, when charging the transistor 122 gate voltage in response to the logic high input signal IN, current flows though transistor 120 to turn on the current mirror 124. When the voltage on the gate of transistor 122 reaches Vs+3.3V, the gate charging current Ic output from the current mirror 124 will flow though transistors 132 and 134, so as to clamp the gate voltage. Transistor 132 is a diode connected MOS, with its gate is connected to its drain, so a gate-to-source voltage drops across the transistor when current flows. Transistor 134 is reversed biased, with its source is connected to the source of transistor 132, but its drain connected to the source of transistor 120 and its gate connected to the transistor 122 gate voltage. When current flows though transistor 132, transistor 134 acts as a switch and functions as an active diode to prevent reverse current path from the source of transistor 120 to the gate of transistor 122 when the gate voltage is low. The advantage of this structure is to reduce current consumption from the charge pump supply at node 130 when the gate is already charged high.

The voltage at the gate Vg of transistor 122 is accordingly higher than the voltage at the drain Vd of transistor 122, where Vd is the voltage at a high voltage supply node. Because of this, a voltage pump circuit (as known in the art) is required to generate the supply voltage (Vcp) at the high voltage supply node 130. In a preferred embodiment Vcp should exceed Vd by at least 3-5 V.

In response to a low logic value for the input signal IN, the driver circuit 100 operates in a manner different from the prior art circuits of FIGS. 1 and 2. The input signal IN turns on transistor 106 (and turns off transistor 102). The circuit 100 responds to this circuit condition by generating the scaled low gate discharging current Idlow' and scaled high gate discharging current Idhigh' (in a manner to be described) to discharge the voltage at the gate Vg of drive transistor 122 in a controlled manner to the voltage at the source Vs of the drive transistor 122. The source voltage Vs will eventually discharge to zero voltage due to the load.

As discussed above, two key parameters are of concern. The first parameter is on/off time. This is normally defined by those skilled in the art as time elapsed from the 50% edge of the input signal transition to when the source changes 10%. So, the on time (or delay) is the time needed to go from the 50% edge of the input signal control to 10% of the source, and the off time (or delay) is the time needed to go from the 50% edge of the input signal control to 90% of the source. These delays should preferably be as small as possible so as to have a fast response time for the driver circuit. This requires large gate charge/discharge currents.

The second parameter is the slew rate. During a source transient, in order to limit the electromagnetic interference (EMI), the slew rate should not be too fast. An exemplary acceptable slew rate would be 4V/μs. This requires gate charge discharge currents which are not too big.

One single value for current can be selected to satisfy both parameters with respect to charging the gate of the drive transistor. In FIG. 3, this is the charging current Ic. However, one single value for current cannot be selected to satisfy both parameters with respect to discharging the gate of the drive transistor. Instead, as shown in FIG. 3, two values for the current are provided: the scaled low gate discharging current Idlow' (to address the slew rate concerns) and scaled high gate discharging current Idhigh' (to address the on/off time concerns).

The driver circuit 100 operates in two phases responsive to the change to the low logic value for the input signal IN. In a first phase, the scaled high gate discharging current Idhigh' is applied to quickly start the discharge of the drive transistor 122 gate voltage at a high rate, and in a second phase the scaled low gate discharging current Idlow' is applied to complete the discharge of the drive transistor 122 gate voltage at a lower rate. There may exist an intermediate phase, between the first phase and second phase, where both the scaled low gate discharging current Idlow' and scaled high gate discharging current Idhigh' are concurrently applied to the gate of drive transistor 122. Thus, in a preferred implementation, it will be understood that the circuit operates in an analog fashion.

The input signal IN turns on transistor 106 (and turns off transistor 102). The current mirror 144 supplies the low gate discharging current Idlow to the high reference node 180 (Vhigh).

The circuit 100 provides two critical operational current paths between a sensing node (Vhigh 180) at the output of the current mirror 144 and the source node of transistor 122. The first current path is through transistor 176 (Vgs176), diode 172 (Vdiode) and transistor 122 (Vds122). The second current path is through transistors 162 (Vds162), 164 (Vds164) and 156 (Vds156). Thus, the first current path has a voltage drop of Vgs176+Vdiode+Vds122. The second current path has a voltage drop of Vds162+Vds164+Vds156.

As the input signal IN transitions to the logic low value, the drain-to-source voltage of transistor 122 (which is fully turned on) is small. Thus, the voltage drop of Vgs176+Vdiode+Vds122 will be smaller than the voltage drop of Vds162+Vds164+Vds156 and as a result the first current path is active (the second current path is not active). With the diode 172 forward biased, a current Idi is present at the input of the current mirror 174. Current mirror 174 generates the high gate discharging current Idhigh and activates the current mirror 184 to apply the scaled high gate discharging current Idhigh' to the gate of the drive transistor 122 during the first phase of operation.

The drive transistor 122 then begins to turn off in response to the discharge of the gate by the scaled high gate discharging current Idhigh'. As the drive transistor 122 turns off, the source voltage of the drive transistor 122 falls and the drain-to-source voltage of transistor 122 rises. At some point in time as drive transistor 122 transitions towards turn off, the voltage drop of Vds162+Vds164+Vds156 will become smaller than the voltage drop of Vgs176+Vdiode+Vds122 and the second current path is active (the first current path is not active). Application of the scaled high gate discharging current Idhigh' to the gate of the drive transistor 122 is terminated. However, the low gate discharging current Idlow activates the current mirror 154 to apply the scaled low gate discharging current Idlow' to the gate of the drive transistor 122 during the second phase of operation. This current is used to complete the full discharge of the gate voltage of transistor 122.

In an exemplary application of the circuit 100 of FIG. 3, the drain of transistor 122 is coupled to a supply voltage at Vd=14V and the charge pumped voltage at node 130 is Vcp=Vd+5V=19V. The load presents an impedance that may be modeled as an inductive-capacitive circuit.

Advantageously, the circuit 100 of FIG. 3 uses only a single high voltage component with diode 172. The remaining components can be implemented as lower voltage devices which do not occupy as much circuit integration area.

Figure 4:
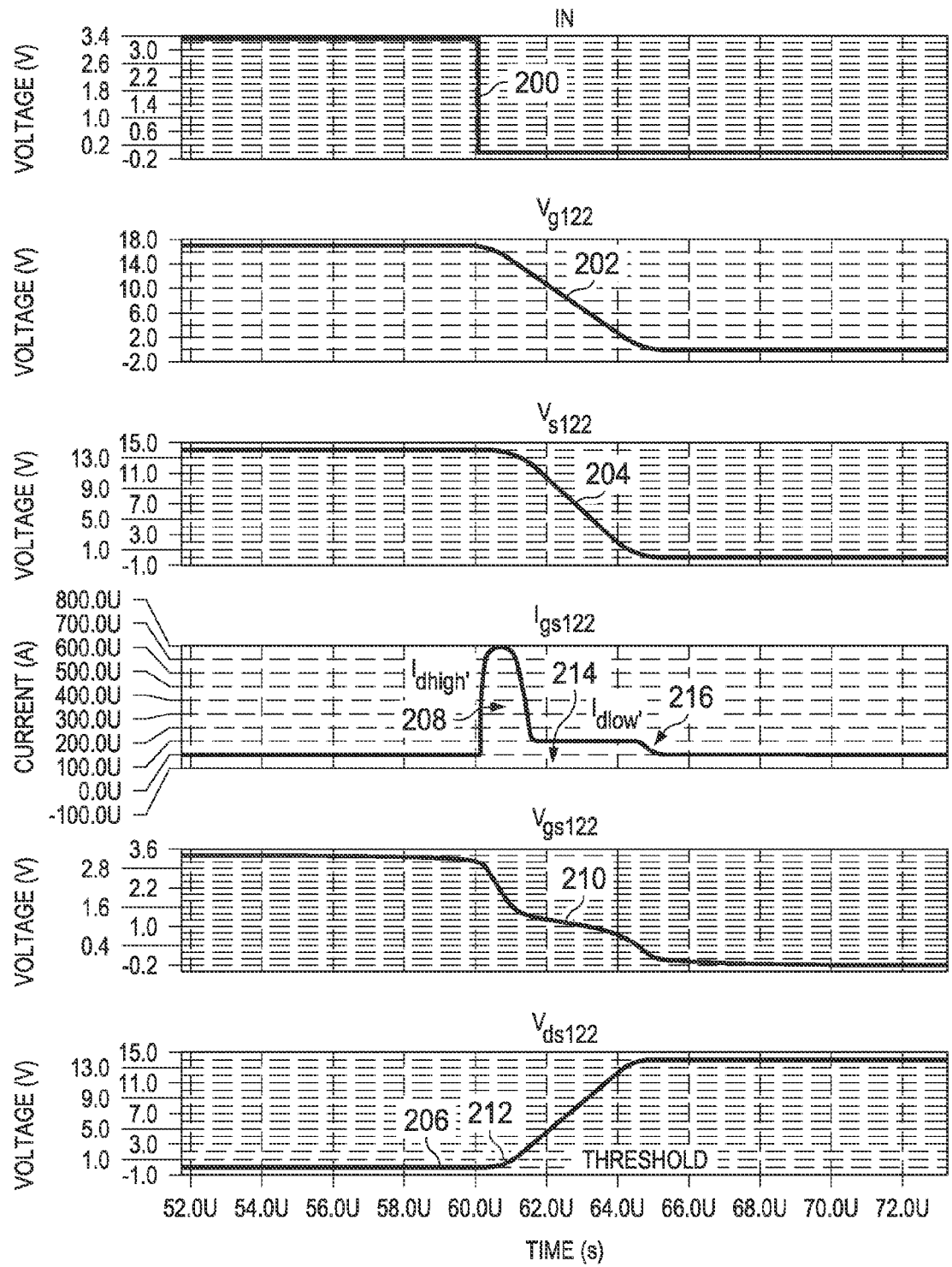
FIG. 4 illustrates operational waveforms for the driver circuit of FIG. 3.

Reference is now made to FIG. 4 which illustrates operational waveforms for the driver circuit 100. When the input signal IN transitions from logic high to logic low (reference 200), the voltage at both the gate and source of drive transistor 122 are high (references 202 and 204) and the drain-to-source voltage is low (reference 206). The circuit 100 functions as a drain-to-source voltage sensor and responsive to the relatively low drain-to-source voltage activates the gate discharge circuitry associated with applying the scaled high gate discharging current Idhigh' (reference 208) during the first phase of operation. This results in a relatively fast drop in the gate-to-source voltage of transistor 122 (reference 210). Responsive thereto, there is a slight delay and then the drain-to-source voltage of transistor 122 rises very slowly (nearly undetectable because the gate-to-source voltage is still high). When the voltage drop of Vds162+Vds164+Vds156 becomes smaller than the voltage drop of Vgs176+Vdiode+Vds122, in other words when the drain-to-source voltage of transistor 122 rises above a threshold (reference 212; corresponding to gate-to-source voltage of transistor 122 falling to the threshold voltage of transistor 122), the gate discharge circuitry associated with applying the scaled high gate discharging current Idhigh' is deactivated, and the gate discharge circuitry associated with applying the scaled low gate discharging current Idlow' to the gate of the drive transistor 122 is activated (reference 214) during the second phase of operation. Application of the scaled low gate discharging current Idlow' to the gate of the drive transistor 122 is subsequently terminated (reference 216). This termination occurs when the drain-to-source voltage of transistor 158 is reduced (together with the discharge of the transistor 122 gate voltage) and the transistor enters the linear region resulting in termination of the current mirroring function.

Figure 5:
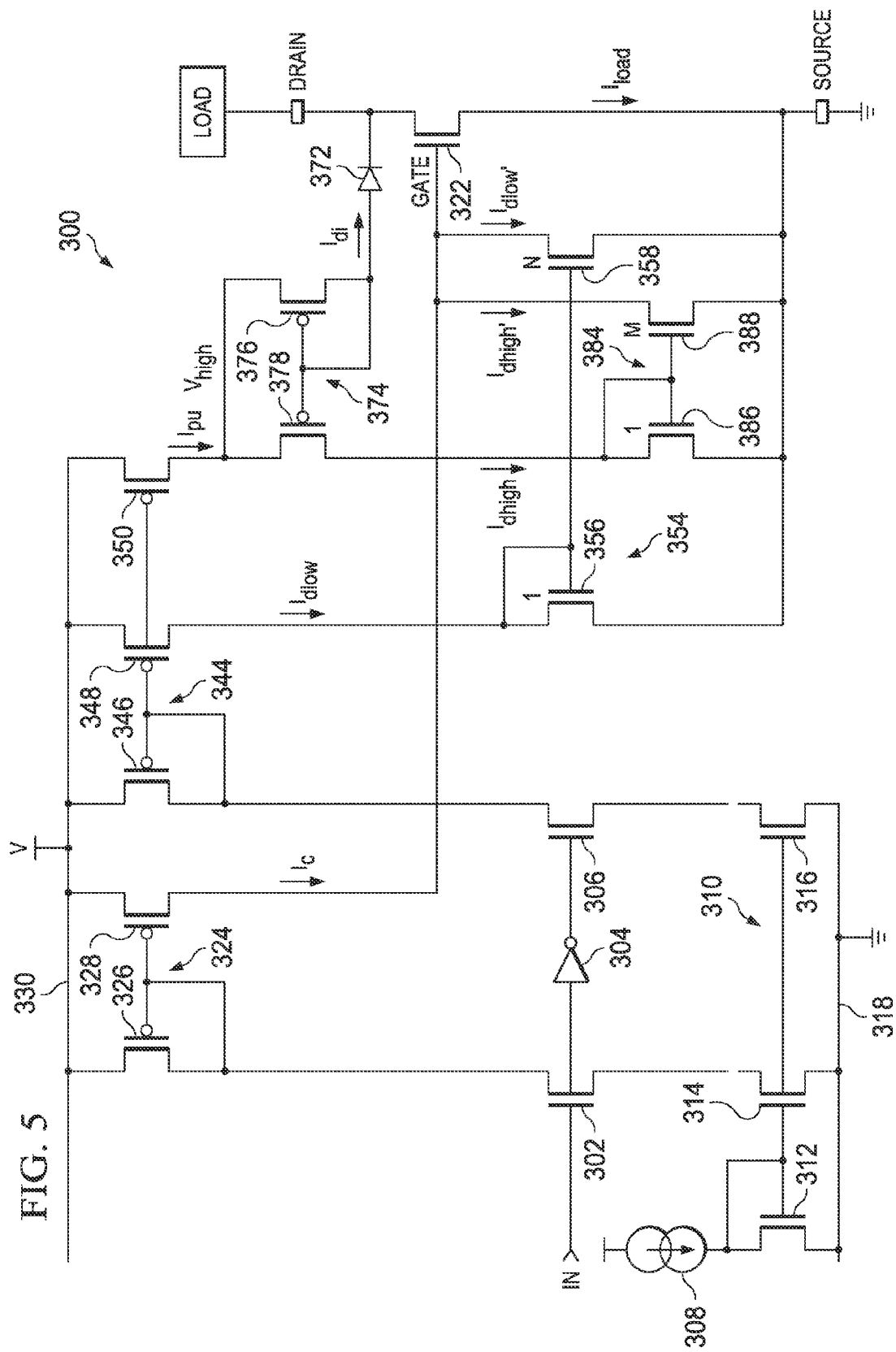
FIG. 5 is a schematic diagram of a low side driver circuit.

Reference is now made to FIG. 5 which illustrates a schematic diagram of a low side driver circuit 300 including a drive transistor 322. The circuit 300 includes a first input transistor 302 having a control node (gate) configured to receive a digital input signal IN. A logical NOT gate 304 has an input coupled to receive the digital input signal IN and an output coupled to a control node (gate) of a second input transistor 306. The input transistors 302 and 306 are preferably n-channel MOSFET devices.

A bias current generator 308 supplies current to an input of a current mirror circuit 310 formed by transistors 312, 314 and 316. The control nodes (gates) of transistors 312, 314 and 316 are connected together and to the conduction node (drain) of transistor 312, where that drain node forms the input of the current mirror circuit 310. The conduction node (drain) of transistor 314 is coupled to the conduction node (source) of transistor 302, and the conduction node (drain) of transistor 316 is coupled to the conduction node (source) of transistor 306. The conduction nodes (sources) of transistors 312, 314 and 316 are coupled to a low voltage supply node 318 (for example ground). The transistors 312, 314 and 316 are preferably n-channel MOSFET devices.

A current mirror 324 formed by transistors 326 and 328 has an input coupled to the conduction node (drain) of transistor 302. The control nodes (gates) of transistors 326 and 328 are connected together and to the conduction node (drain) of transistor 326, where the drain node forms the input of the current mirror circuit 324. The conduction nodes (sources) of transistors 326 and 328 are coupled to a high voltage supply node 330 (V) which in a preferred embodiment is a regulated voltage (for example, of 3.3V in accordance with the high side driver circuit embodiment). The conduction node (drain) of transistor 328 forms an output of the current mirror 324 and supplies a gate charging current Ic to the control node (gate) of the drive transistor 322. The transistors 326 and 328 are preferably p-channel MOSFET devices.

A current mirror 344 formed by transistors 346, 348 and 350 has an input coupled to the conduction node (drain) of transistor 306. The control nodes (gates) of transistors 346, 348 and 350 are connected together and to the conduction node (drain) of transistor 346, where the drain node forms the input of the current mirror circuit 344. The conduction nodes (sources) of transistors 346, 348 and 350 are coupled to the high voltage supply node 330 (V). The conduction node (drain) of transistor 348 forms one output of the current mirror 344 and supplies a low gate discharging current Idlow (when the input signal IN transitions to logic low and transistor 306 is actuated). The conduction node (drain) of transistor 350 forms another output of the current mirror 344 and supplies a pull-up current Ipu (when the input signal IN transitions to logic low and transistor 306 is actuated). The transistors 346, 348 and 350 are preferably p-channel MOSFET devices.

A current mirror 354 formed by transistors 356 and 358 has an input coupled to the conduction node (drain) of transistor 348. The control nodes (gates) of transistors 356 and 358 are connected together and to the conduction node (drain) of transistor 356, where the drain node forms the input of the current mirror circuit 354. The conduction nodes (sources) of transistors 356 and 358 are coupled to the conduction node (source) of drive transistor 322. The conduction node (drain) of transistor 358 forms an output of the current mirror 354 and supplies a scaled low gate discharging current Idlow'. The size of the transistors 356 and 358 of current mirror 354 are selected with a ratio of 1:N so that Idlow'=N*Idlow. In a preferred implementation, N=8, but it will be understood that any suitable value of N may be chosen. The transistors 356 and 358 are preferably n-channel MOSFET devices.

A current mirror 374 formed by transistors 376 and 378 has an input coupled to the conduction node (drain) of drive transistor 322 through a diode 372. The control nodes (gates) of transistors 376 and 378 are connected together and to the conduction node (drain) of transistor 376, where the drain node forms the input of the current mirror circuit 374 connected to the anode terminal of diode 372. The cathode terminal of diode 372 is connected to the conduction node (drain) of drive transistor 322. The conduction nodes (sources) of transistors 376 and 378 are coupled to a high reference node 380 (Vhigh), with the high reference node 380 coupled to the conduction node (drain) of transistor 350. The conduction node (drain) of transistor 378 forms an output of the current mirror 374 and supplies a high gate discharging current Idhigh. The transistors 376 and 378 are preferably p-channel MOSFET devices.

A current mirror 384 formed by transistors 386 and 388 has an input coupled to the conduction node (drain) of transistor 378. The control nodes (gates) of transistors 386 and 388 are connected together and to the conduction node (drain) of transistor 386, where the drain node forms the input of the current mirror circuit 384. The conduction nodes (sources) of transistors 386 and 388 are coupled to the conduction node (source) of drive transistor 322. The conduction node (drain) of transistor 388 forms an output of the current mirror 384 and supplies a scaled high gate discharging current Idhigh'. The size of the transistors 386 and 388 of current mirror 384 are selected with a ratio of 1:M so that Idhigh'=M*Idhigh. In a preferred implementation, M=80, but it will be understood that any suitable value of M may be chosen. The transistors 386 and 388 are preferably n-channel MOSFET devices.

In a preferred implementation, M>N.

In response to a high logic value for the input signal IN, the transistor 102 is turned on (and transistor 106 is turned off). The current mirror supplies the charging current Ic to the gate of the drive transistor 322 so as to charge the gate voltage Vg to a value set by the voltage supply V.

In response to a low logic value for the input signal IN, the transistor 306 is turned on (and transistor 302 is turned off). The circuit 300 senses the drain-to-source voltage of transistor 322 and selectively applies the scaled low gate discharging current Idlow' and the scaled second gate discharging current Idhigh' to discharge the voltage at the gate Vg of drive transistor 322 in a controlled manner to the voltage at the source Vs of the drive transistor 322.

The driver circuit 300 operates in two phases responsive to the change to the low logic value for the input signal IN. In a first phase, the scaled high gate discharging current Idhigh' is applied to start the discharge of the drive transistor 322 gate voltage, and in a second phase the scaled low gate discharging current Idlow' is applied to complete the discharge of the drive transistor 322 gate voltage. There may exist an intermediate phase, between the first phase and second phase, where both the scaled low gate discharging current Idlow' and scaled high gate discharging current Idhigh' are concurrently applied to the gate of drive transistor 322. The switch from the first phase to the second phase is based on the sensed drain-to-source voltage of transistor 322. Initially, the drain-to-source voltage of transistor 322 is very low. As the scaled high gate discharging current Idhigh' is applied, the transistor 322 begins to turn off and the drain-to-source voltage of transistor 322 rises. When the sensed drain-to-source voltage of transistor 322 exceeds a threshold, application of the scaled high gate discharging current Idhigh' is terminated, and the scaled low gate discharging current Idlow' is applied to fully turn off the transistor 322. For a low drain-to-source voltage of transistor 322, current is sourced by transistor 350 of current mirror 344. As transistor 322 begins to turn off, its drain-to-source voltage rises causing a rise in the voltage Vhigh. When Vhigh rises enough to cause transistor 350 to instead operate in the linear region, its current output will reduce to zero as the current mirror function fails and the current Idhigh will go to zero. In an example, with a voltage supply of 3.3V, the termination threshold would equal 3.3V−Vds350−Vds372−Vds376.

Figure 6:
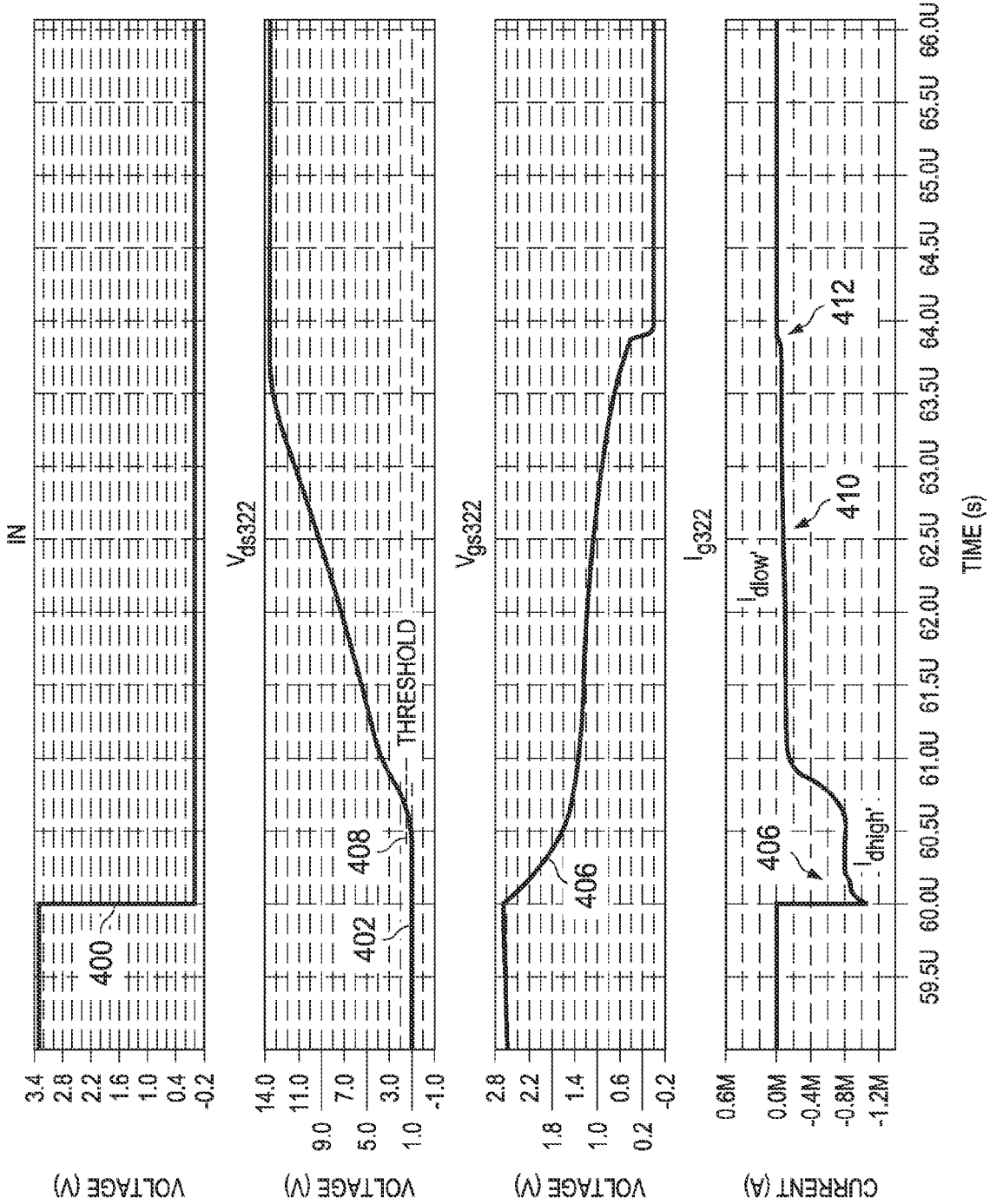
FIG. 6 illustrates operational waveforms for the driver circuit of FIG. 5.

Reference is now made to FIG. 6 which illustrates operational waveforms for the driver circuit 300. When the input signal IN transitions from logic high to logic low (reference 400), the voltage at both the gate and source of drive transistor 322 are high and the drain-to-source voltage is low (reference 402). The circuit 300 functions as a drain-to-source voltage sensor and responsive to the relatively low drain-to-source voltage activates the gate discharge circuitry associated with applying the scaled high gate discharging current Idhigh' (reference 404) during the first phase of operation. This results in a relatively fast drop in the gate-to-source voltage of transistor 322 (reference 406). Responsive thereto, there is a slight delay and then the drain-to-source voltage of transistor 322 rises very slowly (nearly undetectable because the gate-to-source voltage is still high). When the voltage increase exceeds the threshold (reference 408; associated with the gate-to-source voltage of transistor 322 falling to about one threshold of transistor 322), the gate discharge circuitry associated with applying the scaled high gate discharging current Idhigh' is deactivated, and the gate discharge circuitry associated with applying the scaled low gate discharging current Idlow' to the gate of the drive transistor 322 is activated (reference 410) during the second phase of operation. Application of the scaled low gate discharging current Idlow' to the gate of the drive transistor 322 is subsequently terminated (reference 412). This termination occurs when the drain-to-source voltage of transistor 358 is reduced (together with the discharge of the transistor 322 gate voltage) and the transistor enters the linear region resulting in termination of the current mirroring function.

The circuit 300 of FIG. 5 differs from the circuit 100 of FIG. 3 with respect to the configuration of the current mirrors 144 and 344. Specifically, it will be noted that the current mirror 344 includes two outputs, with a first output supplying the current Idlow and the second output supplying the current Ipu.

The circuit 300 of FIG. 5 differs from the circuit 100 of FIG. 3 with respect to the transistors 120, 132 and 134. Transistors 120, 132 and 134 are not needed in the circuit 300 because circuit 300 utilizes a lower power supply at node 330 and the clamping function performed by transistors 120, 132 and 134 in circuit 100 is not required in circuit 300.

The circuit 300 of FIG. 5 further differs from the circuit 100 of FIG. 3 with respect to the transistors 162 and 164. Transistors 162 and 164 are not needed in the circuit 300 because circuit 300 utilizes a lower power supply at node 330.

The circuitry of FIGS. 3 and 5 is preferably implemented as a monolithic semiconductor integrated circuit device. That device in one embodiment would include the drive transistor. In another embodiment, the drive transistor may be provided in an off-chip connection.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit for discharging a gate of a drive transistor having a drain and source, comprising:
   a sensing circuit configured to sense a drain-to-source voltage of the drive transistor;
   a first current sink path coupled to the gate of the drive transistor, said first current sink path configured to apply a first discharge current to the gate of the drive transistor when the sensing circuit senses a first drain-to-source voltage of the drive transistor; and
   a second current sink path coupled to the gate of the drive transistor, said second current sink path configured to apply a second discharge current, less than the first discharge current, to the gate of the drive transistor when the sensing circuit senses a second drain-to-source voltage of the drive transistor that is greater than the first drain-to-source voltage.

2. The circuit of claim 1, wherein the first current sink path is part of a first current mirror configured to scale a first current for application to the gate of the drive transistor in response to said sensing circuit sensing said first drain-to-source voltage of the drive transistor.

3. The circuit of claim 1, wherein the second current sink path is part of a second current mirror configured to scale a second current for application to the gate of the drive transistor in response to said sensing circuit sensing said second lower drain-to-source voltage of the drive transistor.

4. The circuit of claim 1, wherein said second current sink path is further configured to apply the second discharge current to the gate of the drive transistor simultaneously with first current sink path application of the first discharge current to the gate of the drive transistor.

5. The circuit of claim 1, wherein said sensing circuit comprises:
   a diode having a cathode coupled to the drain of the drive transistor and an anode, and
   a first current mirror circuit having an input coupled to the anode of the diode and an output configured to generate a control current that controls the first current sink path to apply the first discharge current to the gate of the drive transistor.

6. The circuit of claim 5, further comprising: a second current mirror circuit having an output coupled to a common node of the first current mirror circuit and an input actuated in response to a control signal indicating turn off of the drive transistor.

7. The circuit of claim 6, further comprising: a third current mirror circuit including said first current sink path and having an input coupled to the output of the first current mirror circuit.

8. The circuit of claim 7, further comprising: a fourth current mirror circuit including said second current sink path and having an input coupled to the second current mirror circuit.

9. The circuit of claim 5, further comprising: a second current mirror circuit having a first output coupled to a common node of the first current mirror circuit, a second output configured to control application of the second discharge current to the gate of the drive transistor by the second current sink path, and an input actuated in response to a control signal indicating turn off of the drive transistor.

10. The circuit of claim 9, further comprising: a third current mirror circuit including said first current sink path and having an input coupled to the output of the first current mirror circuit.

11. The circuit of claim 10, further comprising: a fourth current mirror circuit including said second current sink path and having an input coupled to the second output of the second current mirror circuit.

12. The circuit of claim 1, wherein the circuit is implemented as an integrated circuit device.

13. The circuit of claim 12, wherein the integrated circuit device includes said drive transistor.

14. The circuit of claim 1, wherein the sensing circuit comprises:
   a sense node;
   a first circuit path connected between the sense node and the source of the drive transistor and presenting a first voltage drop including a drain-to-source voltage drop across the drive transistor; and
   a second circuit path connected between the sense node and the source of the drive transistor and presenting a second voltage drop that does not include the drain-to-source voltage drop across the drive transistor;
   wherein the first current sink path is activated if the first voltage drop is less than the second voltage drop and wherein the second current sink path is activated if the second voltage drop is less than the first voltage drop.

15. The circuit of claim 1, wherein the sensing circuit comprises:
   a sense node; and
   a circuit path connected between the sense node and the source of the drive transistor and presenting a voltage drop including a drain-to-source voltage drop across the drive transistor;
   wherein the first current sink path is activated if the voltage drop is less than a threshold.

16. A method for discharging a gate of a drive transistor having a drain and source, comprising:
   sensing a drain-to-source voltage of the drive transistor;
   activating a first current sink path coupled to the gate of the drive transistor to apply a first discharge current to the gate of the drive transistor when the sensed drain-to-source voltage of the drive transistor is lower than a first threshold; and
   activating a second current sink path coupled to the gate of the drive transistor to apply a second discharge current, less than the first discharge current, to the gate of the drive transistor when the sensed drain-to-source voltage of the drive transistor is higher than a second threshold.

17. The method of claim 16, wherein the second discharge current is applied to the gate of the drive transistor simultaneously with application of the first discharge current to the gate of the drive transistor.

18. The method of claim 16, wherein sensing comprises:
   comparing a voltage drop across a circuit path connected between a sense node and the source of the drive transistor which includes a drain-to-source voltage drop across the drive transistor to the first threshold; and
   activating the first current sink path if the voltage drop is less than the first threshold.

19. The method of claim 16, wherein the step of sensing:
   comparing the first voltage drop across a first circuit path connected between a sense node and the source of the drive transistor which includes a drain-to-source voltage drop across the drive transistor to a second voltage drop across a second circuit path connected between the sense node and the source of the drive transistor which does not include the drain-to-source voltage drop across the drive transistor;

activating the first current sink path if the first voltage drop is less than the second voltage drop; and activating the second current sink path if the second voltage drop is less than the first voltage drop.

20. A circuit, comprising:

a drive transistor having a gate, drain and source;

a circuit configured to supply a first current in response to a control signal indicating turn-off of said drive transistor;

a sense node connected to receive said first current;

a first circuit path connected between the sense node and the source of the drive transistor, said first circuit path presenting a first voltage drop from the sense node to the source that is dependent on a drain-to-source voltage of the drive transistor;

a second circuit path connected between the sense node and the source of the drive transistor, said second circuit path presenting a second voltage drop from the sense node to the source that is independent of the drain-to-source voltage of the drive transistor;

a first current sink path configured to apply a first discharge current to the gate of the drive transistor when the first voltage drop is less than the second voltage drop; and a second current sink path configured to apply a second discharge current, less than the first discharge current, to the gate of the drive transistor when the second voltage drop is less than the first voltage drop.

21. The circuit of claim 20, wherein said first circuit path includes a diode connected between the sense node and the drain of the drive transistor, said diode having an anode coupled to the sense node and a cathode coupled to the source.

22. A circuit, comprising:

a drive transistor having a gate, drain and source;

a circuit configured to supply a first current and a second current in response to a control signal indicating turn-off of said drive transistor;

a first node connected to receive said first current;

a second node connected to receive said second current;

a first current mirroring circuit having an input coupled to the first node and configured to receive the first current and including a first current sink path configured to apply a first discharge current to the gate of the drive transistor;

a second current mirroring circuit having a common node at the second node and having an input coupled to the drain of the drive transistor, said second current mirroring circuit outputting a third current when a drain-to-source voltage across the drive transistor is less than a threshold; and a third current mirroring circuit having an input coupled to an output of the second current mirroring circuit and configured to receive the second current and including a second current sink path configured to apply a second discharge current, greater than the first discharge current, to the gate of the drive transistor.

23. The circuit of claim 22, wherein the input of the second current mirroring circuit is connected to the drain of the drive transistor through a diode, said diode having an anode coupled to the input of the second current mirroring circuit and a cathode coupled to the source.

* * * * *